(12) United States Patent
Shiikuma et al.

(10) Patent No.: US 9,054,647 B2
(45) Date of Patent: Jun. 9, 2015

(54) HIGH FREQUENCY POWER AMPLIFIER

(75) Inventors: Kazumi Shiikuma, Tokyo (JP); Makoto Hayakawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 94 days.

(21) Appl. No.: 13/807,902

(22) PCT Filed: Jun. 22, 2011

(86) PCT No.: PCT/JP2011/064857
§ 371 (c)(1),
(2), (4) Date: Dec. 31, 2012

(87) PCT Pub. No.: WO2012/002407
PCT Pub. Date: Jan. 5, 2012

(65) Prior Publication Data
US 2013/0099860 A1    Apr. 25, 2013

(30) Foreign Application Priority Data
Jul. 2, 2010    (JP) ................................ 2010-152115

(51) Int. Cl.
| H03F 3/68 | (2006.01) |
| H03F 3/189 | (2006.01) |
| H01P 5/02 | (2006.01) |
| H03F 1/02 | (2006.01) |
| H03F 1/56 | (2006.01) |
| H03F 3/60 | (2006.01) |
| H03F 3/20 | (2006.01) |

(52) U.S. Cl.
CPC *H03F 3/189* (2013.01); *H01P 5/02* (2013.01); *H03F 1/0288* (2013.01); *H03F 1/56* (2013.01); *H03F 3/602* (2013.01); *H03F 2200/111* (2013.01); *H03F 2200/387* (2013.01); *H03F 3/20* (2013.01); *H03F 3/68* (2013.01)

(58) Field of Classification Search
USPC ............................................ 330/295, 302, 84
See application file for complete search history.

(56) References Cited

U.S. PATENT DOCUMENTS

| 7,518,448 B1* | 4/2009 | Blair et al. ................. 330/124 R |
| 8,193,857 B1* | 6/2012 | Wilson ....................... 330/124 R |
| 8,339,201 B1* | 12/2012 | Wilson et al. ................. 330/295 |
| 2004/0000963 A1 | 1/2004 | Killen et al. |

(Continued)

FOREIGN PATENT DOCUMENTS

| JP | S5610701 A | 2/1981 |
| JP | 03-032207 A | 2/1991 |
| JP | H0472705 U | 6/1992 |

(Continued)

OTHER PUBLICATIONS

Communication dated Dec. 11, 2013, issued by the Japanese Patent Office in corresponding Application No. 2012-522648.

(Continued)

*Primary Examiner* — Hieu Nguyen
(74) *Attorney, Agent, or Firm* — Sughrue Mion, PLLC

(57) ABSTRACT

A Doherty amplifier includes an impedance transformer located between a load and a signal combining point of a carrier amplifier and a peak amplifier. The impedance transformer subjects, at frequencies including a fundamental frequency and at least a second harmonic frequency thereof, an impedance Zo of the load to impedance transformation into a value lower than Zo, for example, (½)×Zo, over a wide band or a plurality of frequency bands.

7 Claims, 4 Drawing Sheets

(56) References Cited

U.S. PATENT DOCUMENTS

| | | |
|---|---|---|
| 2004/0056723 A1 | 3/2004 | Gotou |
| 2008/0007331 A1 | 1/2008 | Suzuki et al. |

FOREIGN PATENT DOCUMENTS

| | | |
|---|---|---|
| JP | 07-022852 A | 1/1995 |
| JP | 2945833 B2 | 9/1999 |
| JP | 2002-124840 A | 4/2002 |
| JP | 2004-032766 A | 1/2004 |
| JP | 2004-120086 A | 4/2004 |
| JP | 2005-130013 A | 5/2005 |
| JP | 2005-303771 A | 10/2005 |
| JP | 2006-166141 A | 6/2006 |
| JP | 2007-150803 A | 6/2007 |
| JP | 2008-005321 A | 1/2008 |
| JP | 2009-165037 A | 7/2009 |
| JP | 2009-182635 A | 8/2009 |
| JP | 2010-021719 A | 1/2010 |
| WO | 2008/099488 A1 | 8/2008 |

OTHER PUBLICATIONS

David M. Pozar, Microwave Engineering 3rd Edition, (John Wiley & Son's), 2005, pp. 258-261.

W. H. Doherty., "A New High Efficiency Power Amplifier for Modulated Waves", Proc. IRE, Sep. 1936, pp. 1163-1182, vol. 24, No. 9.

International Search Report of PCT/JP2011/064857 dated Aug. 16, 2011.

* cited by examiner

| | EMBODIMENT OF THIS INVENTION | | PRIOR ART EXAMPLE | |
|---|---|---|---|---|
| | IMPEDANCE LOOKING INTO LOAD SIDE FROM POINT A OF FIG. 2 | IMPEDANCE INTO LOOKING POINT A SIDE FROM POINT B OF FIG. 2 | IMPEDANCE LOOKING INTO LOAD SIDE FROM POINT A OF FIG. 2 | IMPEDANCE INTO LOOKING POINT A SIDE FROM POINT B OF FIG. 2 |
| FUNDAMENTAL FREQUENCY $f_o$ | $Z_o/2$ | $2 \times Z_o$ | $Z_o/2$ | $2 \times Z_o$ |
| EVEN HARMONIC FREQUENCY $2 \times n \times f_o$ (n IS NATURAL NUMBER) | $Z_o/2$ | $Z_o/2$ | $Z_o$ | $Z_o$ |
| ODD HARMONIC FREQUENCY $(2n-1) \times f_o$ (n IS NATURAL NUMBER) | $Z_o/2$ | $2 \times Z_o$ | $Z_o/2$ | $2 \times Z_o$ |

FIG. 4

HIGH FREQUENCY POWER AMPLIFIER

CROSS REFERENCE TO RELATED APPLICATIONS

This application is a National Stage of International Application No. PCT/JP2011/064857 filed Jun. 22, 2011, claiming priority based on Japanese Patent Application No. 2010-152115 filed Jul. 2, 2010, the contents of all of which are incorporated herein by reference in their entirety.

TECHNICAL FIELD

This invention relates to a high frequency power amplifier.

BACKGROUND ART

A power amplifier used in a wireless communication system is required to have linearity and high efficiency. Especially with an explosive growth of the portable terminal market and the associated infrastructure installation in recent years, a multi-level digitally modulated communication system signal having a mean value of signal amplitudes and a maximum amplitude which are significantly different from each other is often handled. When such signal is amplified by a conventional power amplifier, the amplifier is set to such operation point that the signal may be amplified to the maximum amplitude without distorting the signal for operation. Therefore, there is little time when the amplifier is operating near a saturation output at which relatively high efficiency may be maintained, and in general, the amplifier has had low efficiency.

On the other hand, there is a strong demand for improved efficiency in the market, and an attempt to construct an amplifier having low distortion and high efficiency by a combination of a method of amplifying a signal with high efficiency and a technology of reducing and compensating for the distortion of the signal has been attracting attention.

In order to solve the above-mentioned problem, various technologies of increasing the efficiency of the amplifier while maintaining the linearity have been provided. One example thereof is a Doherty amplifier. The Doherty amplifier includes an amplifier (hereinafter sometimes referred to as carrier amplifier) for performing an operation of amplifying a signal at all times, and an amplifier (hereinafter sometimes referred to as peak amplifier), which is called a peak amplifier or an auxiliary amplifier, for operating only at the time of high power output, to divide an input signal to the carrier amplifier side and the peak amplifier side and combine outputs of the carrier amplifier and the peak amplifier to be output.

A basic configuration of such Doherty amplifier is disclosed in Non Patent Literature 1, Patent Literatures 1 and 2, and the like. The Doherty amplifier includes an amplifier for operating in the vicinity of the saturated output power while maintaining saturation, to thereby realize higher efficiency than a general class A or class AB amplifier even when the output is backed off from the saturated power.

As the carrier amplifier, a class AB or class B biased amplifier is generally used. On the other hand, as the peak amplifier, a class C or class BC biased amplifier is generally used so as to operate only when the instantaneous signal power is high output.

In addition, in order to construct a Doherty amplifier which is further improved in efficiency, an amplifier controlled by a harmonic matching circuit, such as a class E or class F amplifier, which is devised not only in the fundamental matching circuit but also in the harmonic matching circuit, has been adapted. In this case, especially in the second harmonic frequency band, it is often preferred that a load of the amplifier be a short-circuit or near short-circuit impedance for improving the amplifier efficiency.

Patent Literature 3 discloses a method of constructing an even harmonic matching circuit and an odd harmonic matching circuit of the carrier amplifier and the peak amplifier of the Doherty amplifier.

In addition, as illustrated in FIG. 1, the Doherty amplifier disclosed in each of Patent Literatures 4 and 5 includes a quarter-wave impedance transformer as an impedance transformer 120 after combining the signals on the output side. The impedance transformer 120 performs impedance transformation so that an impedance looking into the load side from the signal combining point of a carrier amplifier 114 and a peak amplifier 115 becomes (½)×Zo. Here, Zo is a characteristic impedance of the load, and generally, 50Ω is selected therefor.

Further, an example of a more specific method of realizing the combiner on the output side and the impedance transformer with respect to the load is disclosed in FIG. 6 of Patent Literature 6. In the configuration of Patent Literature 6, in order to further improve the efficiency of the Doherty amplifier, in constructing a second harmonic matching circuit, which is effective in attaining high efficiency especially in the harmonic frequency band, the load impedance looking into the load side from the signal combining point is subjected to impedance transformation into (½)×Zo for the fundamental wave. However, with the configuration of Patent Literature 6, the length of the impedance transformer corresponds to a half wavelength in the second harmonic frequency band, which is equivalent to no impedance transformation so that the impedance looking into the load side from the signal combining point at the second harmonic frequency remains Zo.

In constructing the amplifier matching circuit for further improving the efficiency, it is often preferred that, as disclosed in Patent Literature 3, the load of the amplifier be a short-circuit or near short-circuit impedance for improving the amplifier efficiency especially in the second harmonic frequency band.

In view of the above, with the configuration of the conventional Doherty amplifier, there is a need to construct a matching circuit for transforming, at the output terminal of the amplifier, the impedance Zo looking into the load from the signal combining point to the short-circuit or near substantially short-circuit impedance, for example, Zi (<<Zo), in the second harmonic frequency band, and hence a need for a high impedance transformation ratio.

The resulting high impedance transformation ratio leads to the problem in that the frequency band at which the desired short-circuit or near substantially short-circuit impedance may be obtained in the second harmonic frequency band at the output terminal of the amplifier is narrowed, which is disadvantageous in increasing the bandwidth. For example, Patent Literature 7 refers in paragraph [0006] to the increased loss and decreased frequency bandwidth when the matching circuit having high impedance transformation ratio is inserted in the Doherty amplifier.

PRIOR ART DOCUMENTS

Patent Literature 1: Japanese Unexamined Patent Application Publication (JP-A) No. 2002-124840
Patent Literature 2: Japanese Unexamined Patent Application Publication (JP-A) No. Hei 7-22852

Patent Literature 3: Japanese Unexamined Patent Application Publication (JP-A) No. 2005-303771
Patent Literature 4: Japanese Unexamined Patent Application Publication (JP-A) No. 2010-21719
Patent Literature 5: Japanese Unexamined Patent Application Publication (JP-A) No. 2009-182635
Patent Literature 6: Japanese Patent No. 2945833 (FIG. 6)
Patent Literature 7: Japanese Unexamined Patent Application Publication (JP-A) No. 2009-165037
Non Patent Literature 1: 1936, W. H. Doherty "A New High Efficiency Power Amplifier for Modulated waves", Proc. IRE, Vol. 24, No. 9, September
Non Patent Literature 2: Microwave Engineering 3rd Edition, David M. Pozar (John Wiley & Son's, 2005), pp 258-261

SUMMARY OF INVENTION

Problem to be Solved by Invention

In order to address the above-mentioned problem, Patent Literature 6 discloses in claim 14 and paragraphs [0026] and [0027] a technology of constructing a harmonic matching circuit in the vicinity of a bias feed circuit of a transistor. However, although the load matching circuit of the transistor is affected not only by the bias feed circuit but also by the load matching condition in the harmonic frequency band on the signal line side, Patent Literature 6 does not disclose such effects or the solving means therefor.

Patent Literature 3 also discloses an example in which, for the configuration of the harmonic matching circuit, an even harmonic short circuit is preferred. However, Patent Literature 3 neither discloses nor suggests how the configuration of the impedance transformer circuit from the signal combining point of the Doherty amplifier to the load affects the harmonic matching circuit of the transistor, especially the bandwidth characteristics thereof.

On the other hand, each of Patent Literatures 4 and 5 generally discloses the technology of increasing the signal bandwidth, and neither discloses nor suggests the matching with respect to the harmonic wave, especially the improvement of the matching of the even harmonic wave, such as the second harmonic wave.

This invention aims to solve especially the problem regarding harmonic matching, and to provide means for constructing a high frequency power amplifier represented by a Doherty amplifier so as to have wide frequency band characteristics.

Means to Solve the Problem

An aspect in which this invention is applied to a Doherty amplifier will be described. In order to solve the above-mentioned problem, a Doherty amplifier according to the aspect of this invention includes an impedance transformer located between a load and a signal combining point of a carrier amplifier and a peak amplifier, for subjecting an impedance Zo of the load to impedance transformation into a value lower than Zo, for example, (½)×Zo, at frequencies including a fundamental frequency of an input signal and at least a second harmonic frequency thereof, desirably further including a plurality of even harmonic frequency bands.

More specifically, the Doherty amplifier further includes a quarter wavelength transformer having a characteristic impedance Zo between the carrier amplifier and the signal combining point, in which each of an impedance looking into the signal combining point side from a connection point of the carrier amplifier and the quarter wavelength transformer and an impedance looking into the load side from the signal combining point is (½)×Zo at frequencies including at least the second harmonic frequency of the fundamental frequency, desirably further including a plurality of even harmonic frequency bands.

According to another aspect of this invention, there is provided a power amplification method for use in a high frequency power amplifier including a carrier amplifier and a peak amplifier, the power amplification method including: transforming, between a load provided on an output side of a signal combining point of the carrier amplifier and the peak amplifier, and the signal combining point, an impedance of the load to a half or lower at frequencies including a fundamental frequency of an input signal and at least a second harmonic frequency thereof; and outputting a signal amplified by the carrier amplifier and the peak amplifier.

Effect of the Invention

According to this invention, there may be provided a Doherty amplifier which is configured to include an impedance transformer using a broadband tapered transmission line having transformation bandwidths including the fundamental frequency band and the harmonic frequency bands thereof between the load and the signal combining point of the Doherty amplifier, to thereby prevent not only the fundamental frequency band but also the frequency band corresponding to the harmonic wave from being narrowed in the matching circuit, and which is therefore capable of the harmonic matching operation over a wide band and excellent in amplifier efficiency.

According to the Doherty amplifier of this invention, the matching circuit may be configured to transform, especially in the second harmonic frequency band, the impedance (½)× Zo looking into the load side from the signal combining point to the short-circuit or near substantially short-circuit impedance at the output terminal of the amplifier, and hence the impedance transformation ratio in the second harmonic frequency band may be reduced to half that of the conventional Doherty amplifier. In this manner, the matching bandwidth in the second harmonic frequency band may be prevented from being narrowed. As a result, it is possible to provide an effect that the second harmonic matching circuit may be increased in bandwidth to obtain an even higher amplifier efficiency over a wide band.

BRIEF DESCRIPTION OF THE DRAWINGS

FIG. 4 is a table showing an impedance looking into a load side from a signal combining point A of FIG. 2 and an impedance looking into the point A from a point B with respect to a signal frequency fo and harmonic components thereof, in combination with a prior art example.

BEST MODE FOR CARRYING OUT THE INVENTION

This invention aims to increase a bandwidth of a matching circuit of a high frequency power amplifier, in particular, a Doherty amplifier, for operating in a high frequency region such as a microwave band. This invention adopts, in particular, a configuration in which, without making a significant addition or change to the conventional configuration, an impedance transformer using a broadband tapered transmission line having transformation bandwidths including a fundamental frequency band and harmonic frequency bands thereof is included between a load and a signal combining point of the Doherty amplifier. With this configuration, there may be constructed a Doherty amplifier which prevents not only the fundamental frequency band but also the frequency band corresponding to the harmonic wave from being narrowed in the matching circuit, and which is therefore capable of a harmonic matching operation over a wide band and is excellent in amplifier efficiency.

Figure 1:
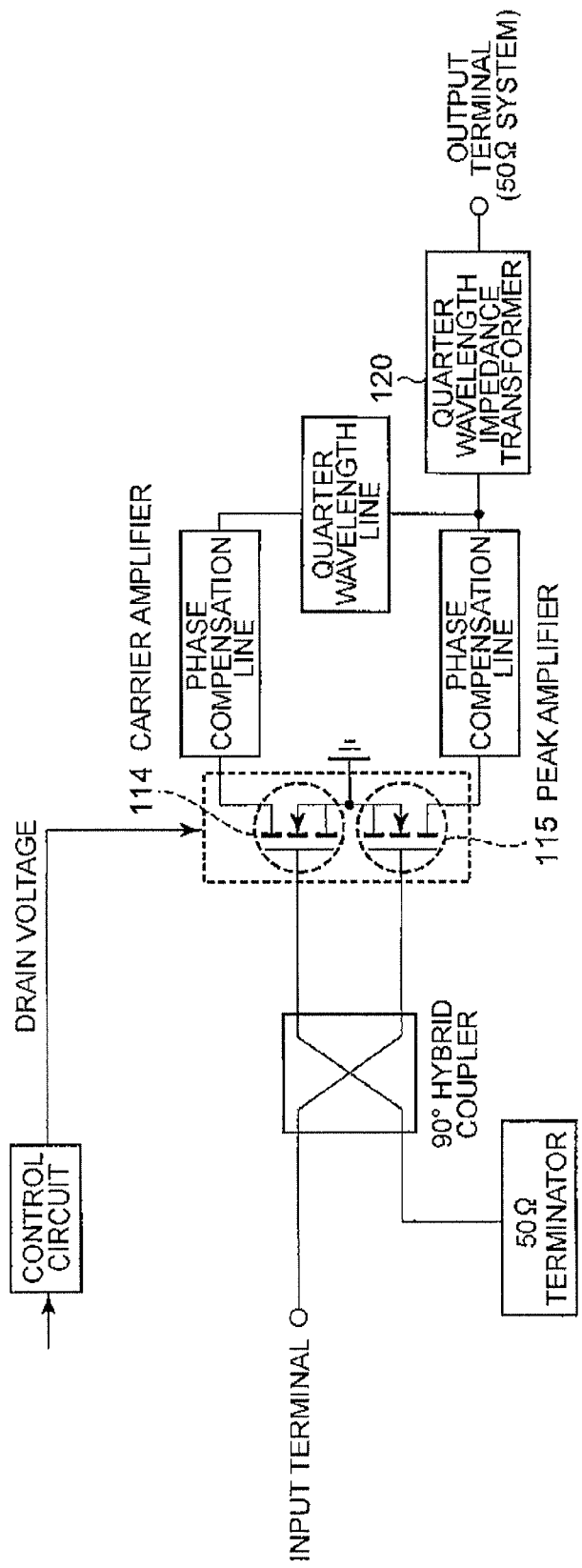
FIG. 1 is a diagram illustrating a configuration example of a conventional Doherty amplifier.

As described above with reference to FIG. 1, a conventional common Doherty amplifier includes, as a preferred operating condition of the Doherty amplifier, a quarter wavelength impedance transformer having a characteristic impedance of $\sqrt{(Zox(½)Zo)}$ as the transformer 120 for subjecting the impedance looking into the load side from the signal combining point of the carrier amplifier 114 and the peak amplifier 115 to impedance transformation into (½)×Zo.

Figure 2:
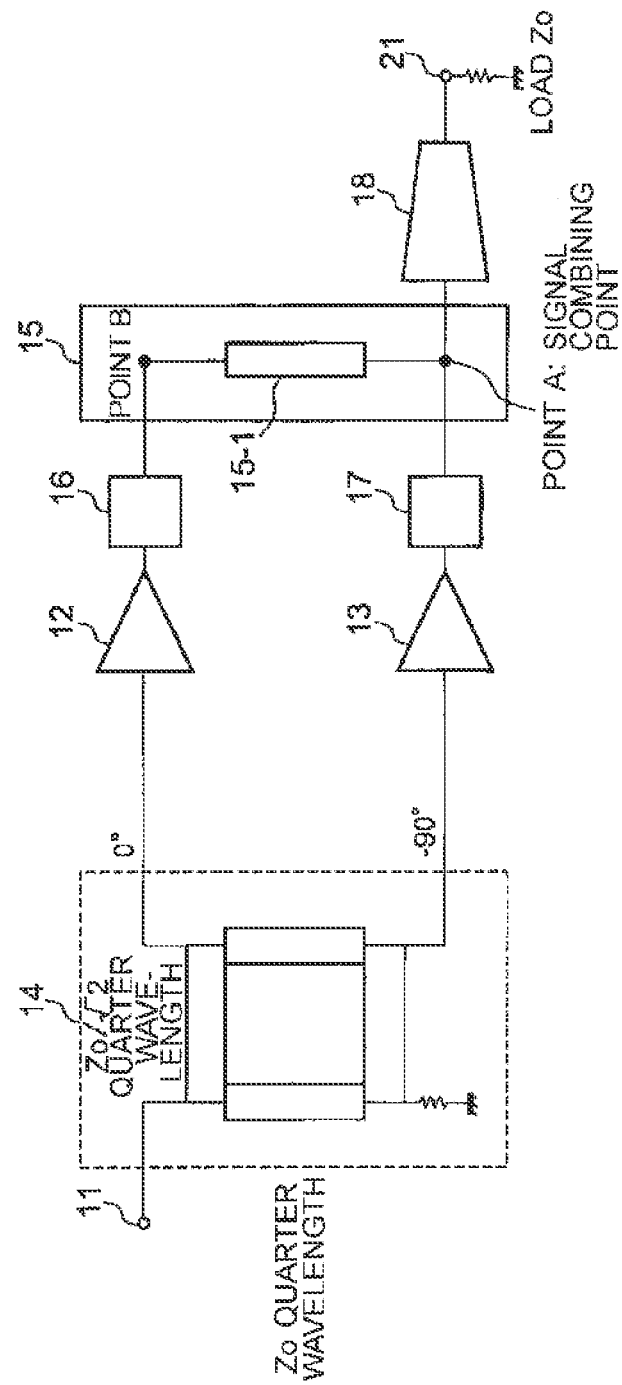
FIG. 2 is a diagram illustrating a configuration of a Doherty amplifier according to an embodiment of this invention.

In contrast, a Doherty amplifier according to this invention includes, as illustrated in a first embodiment of FIG. 2, a broadband transmission line transformer for subjecting, at frequencies including a fundamental frequency of an input signal and at least a second harmonic frequency thereof, desirably further including a plurality of even harmonic frequency bands, an impedance Zo of the load to impedance transformation into approximately (½)×Zo, over a wide band or a plurality of frequency bands.

Next, referring to FIGS. 2 to 4, the Doherty amplifier according to the embodiment of this invention will be described.

Configuration of Embodiment

Referring to FIG. 2, a configuration of the Doherty amplifier according to the embodiment of this invention will be described.

In FIG. 2, the Doherty amplifier according to the embodiment of this invention includes a carrier amplifier 12, a peak amplifier 13, an input signal divider 14 for dividing an input signal from an input terminal 11 to the carrier amplifier 12 and the peak amplifier 13, and a Doherty output combiner circuit 15 including a quarter wavelength transformer 15-1 having a characteristic impedance Zo to operate so as to amplify a signal to be amplified, which is input from the input terminal 11, to a desired power. A matching circuit 16 is connected between the carrier amplifier 12 and the Doherty output combiner circuit 15 and a matching circuit 17 is connected between the peak amplifier 13 and the Doherty output combiner circuit 15. A feature of this embodiment lies in that an impedance transformer 18 constituted by a transformer using a broadband tapered transmission line is connected between a signal combining point A in the Doherty output combiner circuit 15 and the load (impedance Zo) connected to an output terminal 21.

Note that, in this embodiment, the input signal divider 14 is exemplified by a branch line power divider. However, configurations of the input signal divider 14, the carrier amplifier 12, and the peak amplifier 13 are well known, and hence detailed descriptions thereof are omitted.

Operation of Embodiment

An operating principle of the general Doherty amplifier is well known, and hence a detailed description thereof is omitted and an operation according to this embodiment will be described by way of a specific example. In the following, as an example, a case where the transformer using the broadband tapered transmission line is constituted by a Klopfenstein transformer will be sequentially described.

A specific circuit configuration of the Klopfenstein transformer is disclosed in, for example, Non Patent Literature 2. The Klopfenstein transformer is, among other impedance transformers having the same length of line, a circuit form capable of realizing a low reflection coefficient over a wide band, that is, a circuit form suitable for transforming the impedance Zo to, for example, approximately (½)×Zo over a wide band.

Figure 3:
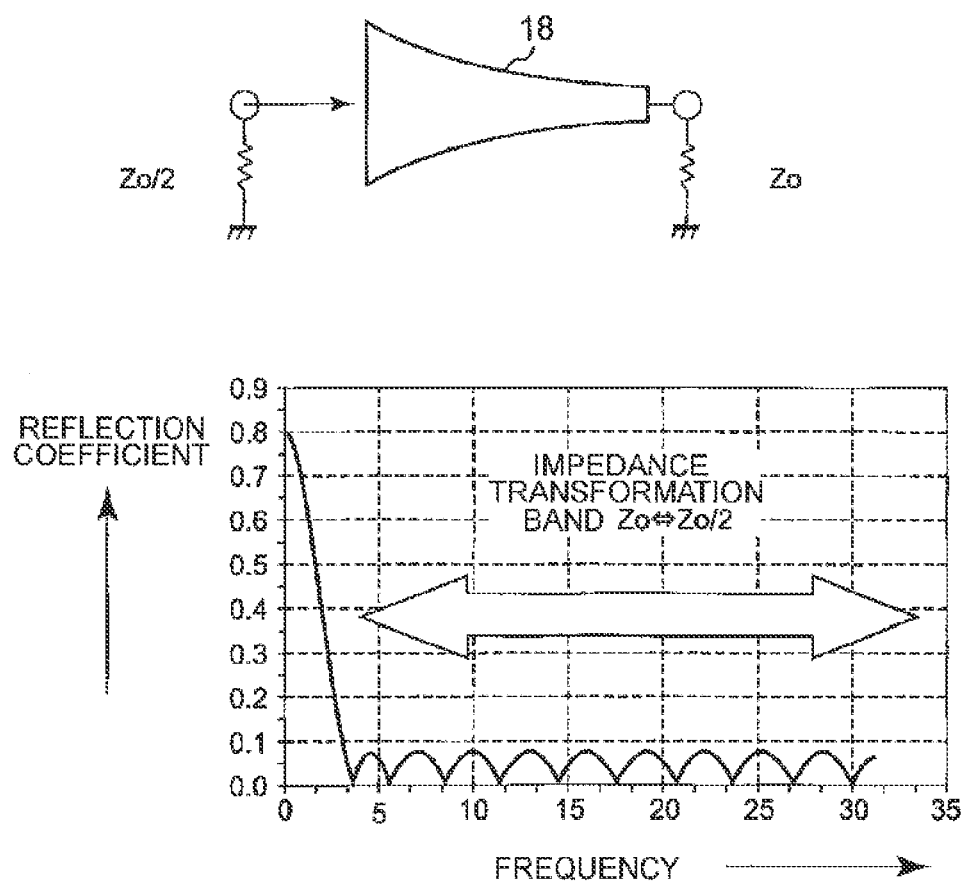
FIG. 3 is a diagram illustrating an example of calculating, as an example of a transformer using a broadband tapered transmission line illustrated in FIG. 2, an outer shape and a reflection coefficient, that is, impedance transformation characteristics of a Klopfenstein transformer.

FIG. 3 illustrates an example of calculating an outer shape and a reflection coefficient, that is, impedance transformation characteristics of the Klopfenstein transformer. The horizontal axis is an arbitrary scale corresponding to the frequency, and indicates that a desired impedance transformation ratio is obtained over a wide band generally at frequencies of scale 4 and larger.

A case is considered of the Doherty amplifier configured to use the Klopfenstein transformer as the transformer using the broadband tapered transmission line illustrated in FIG. 2, and to use a circuit for transforming the impedance from Zo to (½)×Zo at least at a frequency fo and the second harmonic frequency 2×fo thereof, where fo is a desired signal frequency (fundamental frequency) at which the amplifier is to be operated, and n×fo (where n is a natural number of 2 or more) is a harmonic frequency thereof.

The impedance looking into the load side from the signal combining point A and the impedance looking into the point A side from a point B, which is set between the signal combining point A and the carrier amplifier 12, of FIG. 2 are collectively shown in FIG. 4 with respect to the signal frequency fo and harmonic components thereof.

The impedance looking into the peak amplifier 13 side from the signal combining point A is set to an open-circuit or corresponding high impedance in the configuration of the general Doherty amplifier, and hence can be considered separately from the circuit. Therefore, the impedance looking into the load from the signal combining point A is transformed by the quarter wavelength transformer 15-1, which is located between the signal combining point A and the point B and has the characteristic impedance Zo at the quarter wavelength with respect to the fundamental wave, and the impedance is transformed depending on the frequency, that is, into $Zo^2/[(½)×Zo)]=2×Zo$ at the fundamental wave and in odd harmonic frequency bands and into $Zo^2/Zo=Zo$ in even harmonic frequency bands, to thereby generate the result as in FIG. 4.

In FIG. 4, the impedances of the points A and B as equivalent function points in the Doherty amplifier according to the prior art are also determined and shown along with the above-mentioned result.

Therefore, a load impedance of the carrier amplifier according to the embodiment of this invention is considered first. As the load impedance of the carrier amplifier 12, that is, in this case, the impedance looking into the quarter wavelength transformer 15-1 side from the point B of FIG. 2, the impedance 2×Zo equivalent to that of the Doherty amplifier according the prior art is obtained at the fundamental frequency and the odd harmonic frequency. This means that the Doherty amplifier according to this embodiment does not require a significant change in design as compared to the Doherty amplifier according to the prior art. On the other hand, at the even harmonic frequency, the impedance looking into the point A side from the point B of FIG. 2, which is Zo in the Doherty amplifier according to the prior art, may be reduced to (½)×Zo in this embodiment, which is half the value of the prior art example.

Next, a load impedance of the peak amplifier 13 will be considered. As the load impedance of the peak amplifier 13, that is, in this case, the impedance looking into the load side from the signal combining point A of FIG. 2, similarly to the load impedance of the carrier amplifier 12 described above, the impedance (½)×Zo equivalent to that of the Doherty amplifier according to the prior art is obtained at the fundamental frequency and the odd harmonic frequency. This corresponds to the fact that the Doherty amplifier according to this embodiment does not require a significant change in design from the Doherty amplifier according to the prior art. On the other hand, at the odd harmonic frequency, the impedance looking into the load side from the signal combining point A of FIG. 2, which is Zo in the Doherty amplifier according to the prior art, may be reduced to (½)×Zo in this embodiment, which is half the value of the prior art example.

Note that, in the above description, for simple description, the impedance looking into the point B from the signal combining point A appears to be equivalent to the current source, and hence the impedance is assumed to be sufficiently high as compared to Zo. This characteristic in the Doherty amplifier is well known.

Effects of Embodiment

As described above, the Doherty amplifier according to the embodiment described above provides the following effects.

In constructing an amplifier matching circuit for further improving the amplifier efficiency, considering the fact that it is preferred that the load of the amplifier be the short-circuit or near short-circuit impedance for improving the amplifier efficiency especially in the second harmonic frequency band, in the configuration of the Doherty amplifier according to this embodiment, the matching circuit may be constructed to transform the impedance (½)×Zo looking into the load side from the signal combining point to the short-circuit or near substantially short-circuit impedance at the output terminal of the amplifier in the second harmonic frequency band. Therefore, the impedance transformation ratio in the second harmonic frequency band may be reduced to half that of the conventional Doherty amplifier. In this manner, the matching bandwidth in the second harmonic frequency band may be prevented from being narrowed. As a result, it is possible to provide an effect that the second harmonic matching circuit may be increased in bandwidth to obtain an even higher amplifier efficiency over a wide band, and the reduction in efficiency due to a mismatch may also be suppressed.

In addition, in the fundamental frequency band or the odd harmonic frequency bands, the impedance transformation ratio having the same value as that of the conventional Doherty amplifier may be obtained. Therefore, it is possible to obtain an effect that the reduction in amplifier efficiency described above may be prevented without making a significant change from the configuration of the conventional Doherty amplifier. This also provides an effect that the design may be made in a short period of time by utilizing the design method and resources of the prior art.

Other Embodiments

The above description has been made for the case where the impedance transformation is (½)×Zo. However, this invention is not limited thereto as long as, depending on the configuration of the amplifier to which this invention is adapted, the impedance Zo of the load may be reduced to a value lower than Zo at frequencies including the fundamental frequency and at least the second harmonic frequency thereof, and may be adapted to a case where, for example, the impedance is transformed to (⅓)×Zo.

As another embodiment of this invention, with the basic configuration being as described above, to the transformer using the broadband tapered transmission line, in place of the Klopfenstein transformer, many broadband transformer types, such as a multi-stage quarter wavelength transformer, a Chebyshev transformer, and an exponential taper transformer, which are well known as a broadband transformers, may be adapted. Those transformers operate substantially the same as the Klopfenstein transformer and have similar effects. It should be noted, however, that the Klopfenstein transformer with little variation in frequency characteristics of the impedance transformation ratio and the reflection coefficient in the harmonic frequency bands and a low reflection coefficient at the same length of line, that is, little variation in frequency characteristics of the impedance value after the transformation may be desirably used to further increase the effects of this invention.

In addition, as the configuration of the Doherty amplifier for description, a 2-way symmetric Doherty amplifier in which the carrier amplifier and the peak amplifier have substantially the same saturation power characteristics has been described as an example. However, as can be understood from the above-mentioned embodiments and the description of the operation, it should be apparent that this invention may be easily adapted or applied to a configuration of a Doherty amplifier having different saturation power characteristics on the carrier amplifier side and the peak amplifier side, which is generally often called asymmetric Doherty amplifier. Further, this invention may be easily adapted to an N-way Doherty amplifier constituted by using a plurality of carrier amplifiers and peak amplifiers, by appropriately changing the impedance transformation ratio of the broadband tapered transmission line to a desired value, for example, a value lower than 1 based on the principle of this invention.

INDUSTRIAL APPLICABILITY

This invention is suitable for a high frequency power amplifier, for example, a high-frequency high-output power amplifier used in a UHF band to microwave and millimeter-wave bands for mobile communication and broadcasting equipment.

REFERENCE SIGNS LIST

11 input terminal
12 carrier amplifier
13 peak amplifier
14 input signal divider
15 Doherty output combiner circuit
15-1 quarter wavelength transformer
16, 17 matching circuit
18 impedance transformer
21 output terminal

The invention claimed is:
1. A high frequency power amplifier, comprising:
a carrier amplifier;
a peak amplifier; and
an impedance transformer located between a load and a signal combining point of the carrier amplifier and the peak amplifier, that subjects an impedance Zo of the load to impedance transformation into a value lower than Zo at frequencies including a fundamental frequency of an input signal and at least a second harmonic frequency thereof,
wherein the impedance transformer is a transformer using a broadband tapered transmission line, and is any one of a Klopfenstein transformer, a multi-stage quarter wavelength transformer, a Chebyshev transformer, and an exponential taper transformer.

2. The high frequency power amplifier according to claim 1, wherein the impedance transformer subjects the impedance Zo of the load to the impedance transformation into (½)×Zo at the frequencies including the fundamental frequency and at least the second harmonic frequency thereof.

3. The high frequency power amplifier according to claim 1, wherein the frequencies include the fundamental frequency and a plurality of even harmonic frequency bands thereof.

4. The high frequency power amplifier according to claim 1, further comprising a quarter wavelength transformer having a characteristic impedance Zo between the carrier amplifier and the signal combining point,
wherein each of an impedance looking into the signal combining point side from a connection point of the carrier amplifier and the quarter wavelength transformer and an impedance looking into the load side from the signal combining point is (½)×Zo at frequencies including at least the second harmonic frequency of the fundamental frequency.

5. The high frequency power amplifier according to claim 4, wherein an impedance looking into the signal combining point from the peak amplifier side is also (½)×Zo at the frequencies including the fundamental frequency and at least the second harmonic frequency thereof.

6. The high frequency power amplifier according to claim 1, wherein the high frequency power amplifier comprises a 2-way symmetric Doherty amplifier in which the carrier amplifier and the peak amplifier have substantially the same saturation power characteristics, or an asymmetric Doherty amplifier in which the carrier amplifier and the peak amplifier have different saturation power characteristics.

7. A power amplification method for use in a high frequency power amplifier including a carrier amplifier and a peak amplifier, the power amplification method comprising:
transforming, between a load provided on an output side of a signal combining point of the carrier amplifier and the peak amplifier, and the signal combining point, an impedance Zo of the load to a value lower than Zo with an impedance transformer at frequencies including a fundamental frequency of an input signal and at least a second harmonic frequency thereof; and
outputting a signal amplified by the carrier amplifier and the peak amplifier,
wherein the impedance transformer is a transformer using a broadband tapered transmission line, and is any one of a Klopfenstein transformer, a multi-stage quarter wavelength transformer, a Chebyshev transformer, and an exponential taper transformer.

* * * * *